United States Patent
Sugiura

(10) Patent No.: US 8,674,415 B2
(45) Date of Patent: Mar. 18, 2014

(54) HIGH FREQUENCY SEMICONDUCTOR SWITCH

(75) Inventor: Tsuyoshi Sugiura, Yokohama (JP)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/354,764

(22) Filed: Jan. 20, 2012

(65) Prior Publication Data

US 2013/0187204 A1    Jul. 25, 2013

(51) Int. Cl.
*H01L 29/76*      (2006.01)

(52) U.S. Cl.
USPC .......... 257/288; 257/213; 257/266; 257/287; 257/341; 257/401

(58) Field of Classification Search
USPC ............. 257/213, 266, 287, 288, 341, 401, 257/E29.116, E29.242
See application file for complete search history.

(56) References Cited

U.S. PATENT DOCUMENTS

| | | |
|---|---|---|
| 5,789,791 A | 8/1998 | Bergemont |
| 6,020,613 A | 2/2000 | Udomoto et al. |
| 2004/0164354 A1 | 8/2004 | Mergens et al. |

FOREIGN PATENT DOCUMENTS

JP    11-103072      4/1999

OTHER PUBLICATIONS

Korean Office Action, and English translation thereof, issued in Korean Patent Application No. 10-2011-0087274 dated Oct. 26, 2012.

*Primary Examiner* — Andy Huynh
(74) *Attorney, Agent, or Firm* — McDermott Will & Emery LLP

(57) ABSTRACT

There is provided a high frequency semiconductor switch for improving insertion loss characteristics and harmonic characteristics by providing good voltage distribution in a gate wiring. The field effect transistor includes a source wiring electrically connected to a source region formed on a substrate and extending unidirectionally; a drain wiring electrically connected to a drain region formed on the substrate and extending in parallel with the source wiring; a gate having a parallel portion extending between the source wiring and the drain wiring in approximately parallel with the source wiring and the drain wiring; a gate wiring applying voltage to the gate; and a gate via electrically connecting the gate to the gate wiring, the parallel portion including two ends and formed with a path applying voltage to each of the two ends from the gate via.

6 Claims, 9 Drawing Sheets

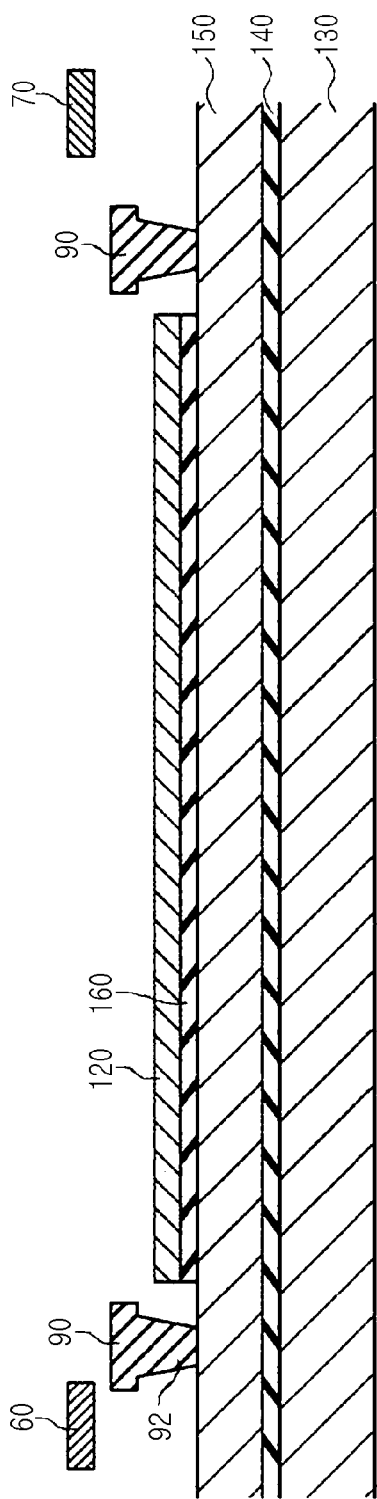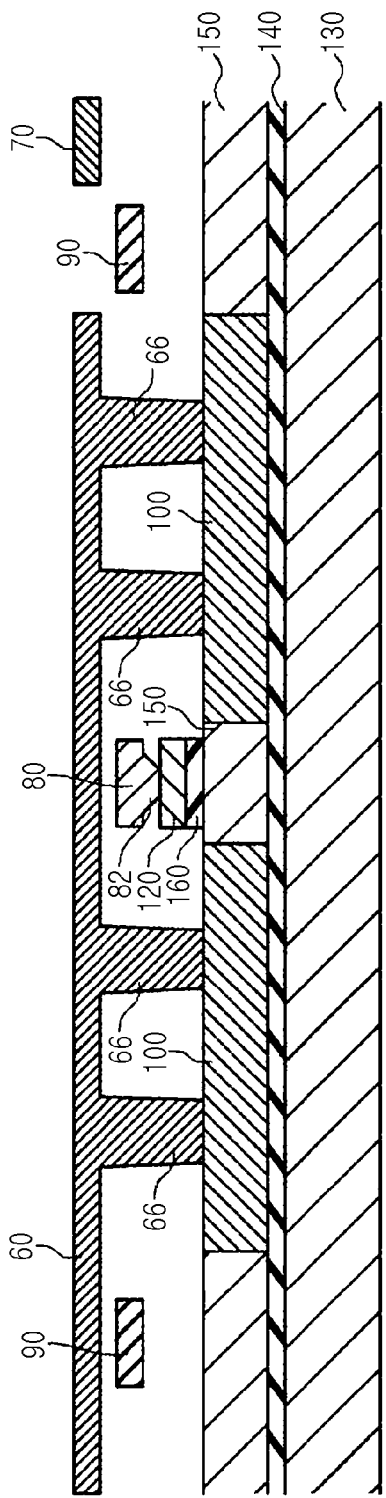

HIGH FREQUENCY SEMICONDUCTOR SWITCH

BACKGROUND OF THE INVENTION

1. Field of the Invention

The present invention relates to a high frequency semiconductor switch, and more particularly, to a high frequency semiconductor switch used in wireless communications apparatuses.

2. Description of the Related Art

A front end of wireless communications apparatuses such as mobile phones, PCs, and the like, has had a high frequency semiconductor switch mounted therein. The high frequency semiconductor switch switches a path along which a signal received from an antenna is transferred and a path along which a signal transmitted from the antenna is transferred. To facilitate switching, the high frequency semiconductor switch includes a plurality of field effect transistors (FETs).

The FETs are connected to a transmission terminal to which a transmission signal is input, or a reception terminal from which a receiving signal is output. When a signal is transmitted, voltage is applied to a gate of the FET connected to the transmission terminal and when a signal is received, voltage is applied to the gate of the FET connected to the reception terminal, such that a signal transfer path is formed.

As the FET, a comb transistor has been known in the art (for example, see Patent Document 1: Japanese Patent Laid-Open Publication No. 11-103072). The comb transistor has a structure in which a source wiring connected to a source region and a drain wiring connected to a drain region have comb shapes, and comb teeth are disposed to the left and right to be alternately engaged with each other, when viewed from above. The gate is formed to be a comb gate, and the source wiring and the drain wiring may be disposed to be parallel with the teeth.

However, in the above-mentioned comb gate, the comb teeth portions extend for a distance equal to or longer than the source region and the drain region. In this case, voltage may fall due to a resistance component of the lengthwise extended gate and as a result, adequate voltage distribution may not be obtained. As a result, insertion loss characteristics and harmonic characteristics may be deteriorated.

SUMMARY OF THE INVENTION

An aspect of the present invention provides a high frequency semiconductor switch capable of improving insertion loss characteristics and harmonic characteristics by allowing for good voltage distribution in a gate wiring.

According to an aspect of the present invention, there is provided a field effect transistor included in a high frequency semiconductor switch for switching wireless communications, including: a source wiring electrically connected to a source region formed on a substrate and extending unidirectionally; a drain wiring electrically connected to a drain region formed on the substrate and extending in parallel with the source wiring; a gate having a parallel portion extending between the source wiring and the drain wiring in parallel therewith; a gate wiring applying voltage to the gate; and a gate via electrically connecting the gate to the gate wiring, wherein the parallel portion has two ends and is formed with a path applying voltage to each of the two ends from the gate via.

According to the configuration, the parallel portion is formed with two ends and the path applying voltage from the gate via is divided. Therefore, the embodiments of the present invention can reduce voltage drop due to a length of a path being short, thereby allowing voltage distribution to be more uniform.

BRIEF DESCRIPTION OF THE DRAWINGS

The above and other aspects, features and other advantages of the present invention will be more clearly understood from the following detailed description taken in conjunction with the accompanying drawings, in which:

FIG. 6 is a cross-sectional view taken along line 6-6 of FIG. 2;

FIG. 7 is a cross-sectional view taken along line 7-7 of FIG. 2;

DETAILED DESCRIPTION OF THE EMBODIMENTS

Figure 1:
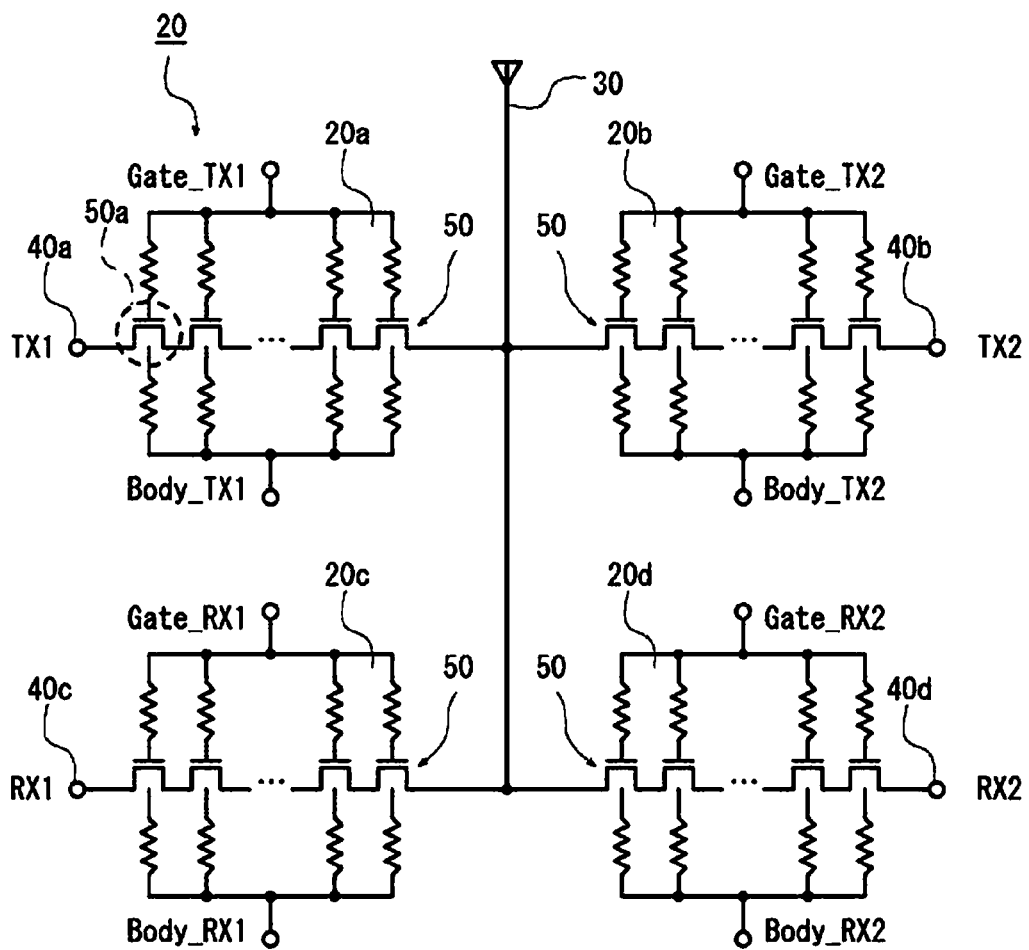
FIG. 1 is a diagram showing an example of a schematic circuit configuration of a high frequency semiconductor switch according to a first embodiment of the present invention.

Hereinafter, embodiments of the present invention will be described in detail with reference to the accompanying drawings. In explaining the drawings, like reference numerals will denote like elements throughout the specification and the overlapped explanation thereof will be omitted. Further, dimension rates of the drawings may be exaggerated for convenience so that they may be different from actual rates thereof. In addition, expressions "formed on ~" may include a case in which it is indirectly formed thereon through other object as well as a case in which it is directly formed thereon. In the specification, "approximately" includes errors in manufacturing and degree of manufacturing accuracy. For example, "approximately" in parallel also includes a case in which it is not completely in parallel according to errors in manufacturing and the degree of manufacturing accuracy.

(First Embodiment)

FIG. 1 is a diagram showing an example of a schematic circuit configuration of a high frequency semiconductor switch according to a first embodiment of the present invention.

As shown in FIG. 1, a high frequency semiconductor switch 10 may include four series switches 20a to 20d. The series switches 20a to 20d may be disposed between an antenna terminal 30 and RF terminals 40a to 40d. The series switches 20a to 20d may each include at least one field effect transistor (hereinafter, referred to as FET). As shown in FIG. 1, gates of a plurality of FETs included in the same series switches 20a to 20d may simultaneously receive voltage applied thereto. Therefore, conduction between the antenna terminal 30 and the RF terminals 40a to 40d may be controlled by switching voltage applied to the gates for each series switch, 20a to 20d. Alternatively, a body of the FET may also have voltage applied thereto.

In an example shown in FIG. 1, in the RF terminals 40a to 40d, the RF terminals 40a and 40b may be a transmission terminal Tx and the RF terminals 40c and 40d may be a reception terminal Rx. The transmission and reception terminals may be, for example, terminals having different frequencies for a frequency division multiple communications mode or a terminal to be switched every time for a time division multiple communications mode.

For example, when the series switch 20a is turned-on and the other switch switches 20c and 20d are turned-off, a frequency of 900MHz may be transmitted, and when the series switch 20c is turned-on and other series switches 20a, 20b, and 20d are turned-off, a frequency of 900MHz may be received. The number of series switches 20 and RF terminals 40 may be appropriately increased or reduced according to transmission and reception modes or necessary diversity.

Next, a structure of one of the plurality of FETs 50 included in the series switches 20a to 20d will be mainly described.

Figure 2:
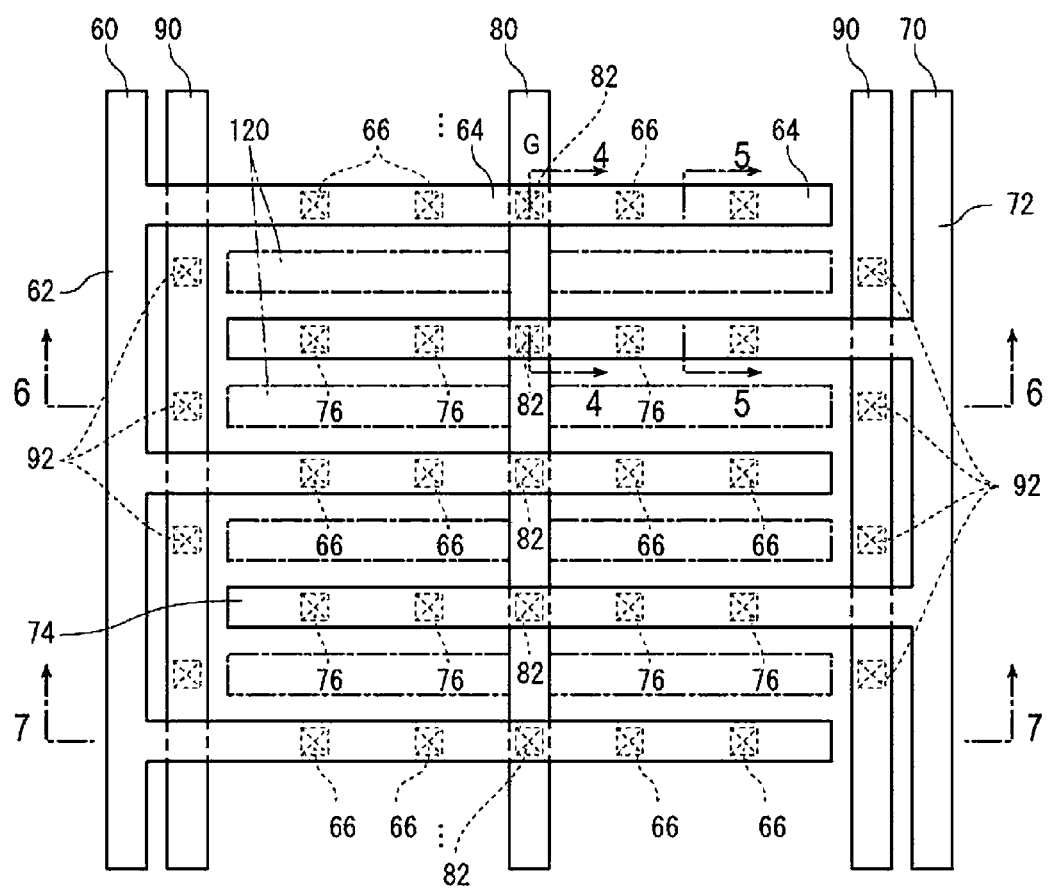
FIG. 2 a schematic plan view showing gate, source, and drain wirings of an FET included in a switch according to the first embodiment of the present invention.
Figure 3:
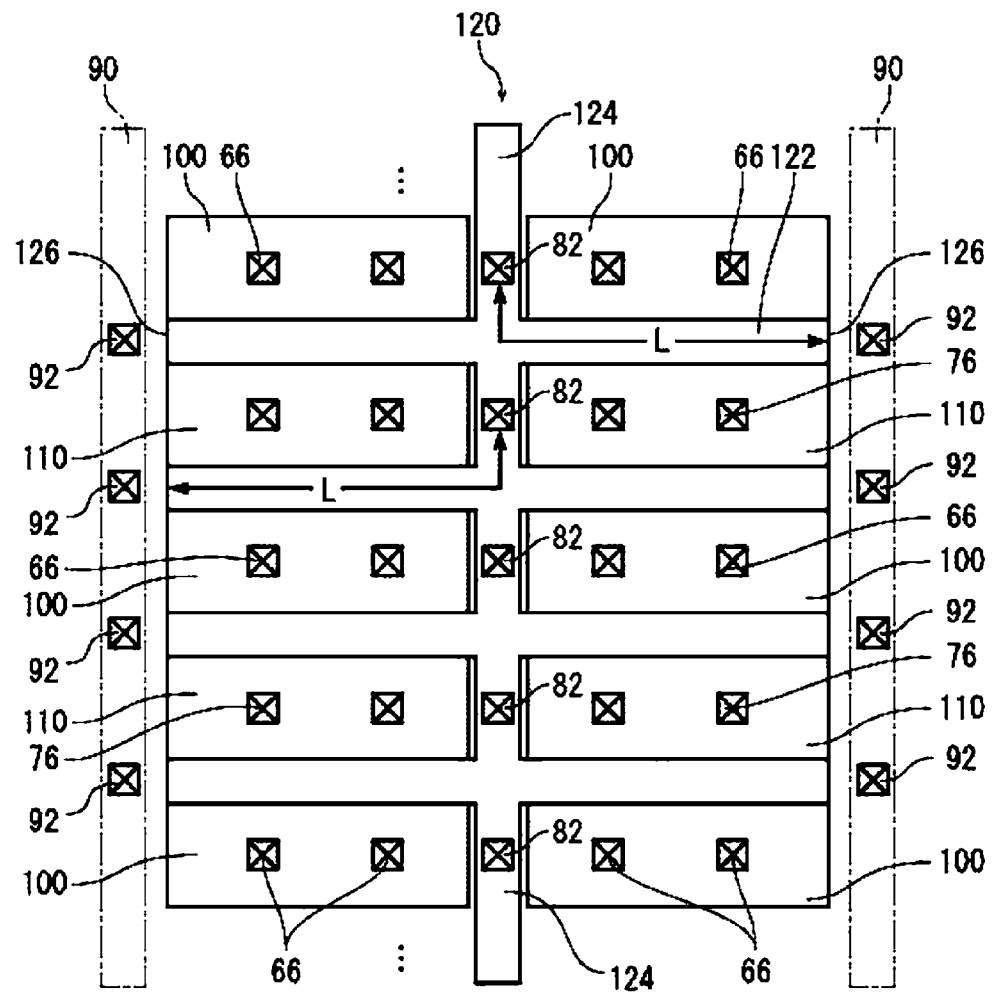
FIG. 3 is a plan view showing a gate, a source region, and a drain region that are disposed under wirings according to the first embodiment of the present invention.

FIG. 2 is a schematic plan view showing gate, source, and drain wirings of an FET included in a switch according to the first embodiment of the present invention and FIG. 3 is a plan view showing a gate, a source region, and a drain region that are disposed under wirings according to the first embodiment of the present invention. FIG. 2 shows a wiring of FET 50a roundly enclosed by, for example, a dotted line of FIG. 1. FIG. 3 shows the gate, the source region, and the drain region that are disposed under the wirings of FIG. 2.

As shown in FIG. 2, the FET 50a may be mounted with a source wiring 60, a drain wiring 70, a gate wiring 80, and a body wiring 90.

The source wiring 60 and the drain wiring 70 may be each formed in a comb type. The source wiring 60 may include a comb stem portion 62 and a teeth portion 64 extending in a direction (one direction) approximately orthogonal to the stem portion 62. The teeth portion 64 may be formed to have a via 66 therein. The source wiring 60 may be connected to a source region 100 shown in FIG. 3 through the via 66. The source region 100 may be formed on a substrate, and as shown in FIG. 3, may be divided into both sides of the gate 120. However, since an upper portion of the teeth portion 64 of the source wiring 60 is formed to continue therein, voltage may be applied to both sides of the divided source region 100 from the source wiring 60.

The drain wiring 70 may be formed to be similar to the source wiring 60. The drain wiring 70 may include a comb stem portion 72 and a teeth portion 74 extending in a direction (one direction) approximately orthogonal to the stem portion 72. The teeth portion 74 may be formed to have a via 76. The drain wiring 70 may be connected to a drain region 110 shown in FIG. 3 through the via 76. The drain region 110 may be formed on the substrate, and as shown in FIG. 3, may be divided into both sides of the gate 120. However, since an upper portion of the teeth portion 74 of the drain wiring 70 is formed to continue therein, voltage may be applied to both sides of the divided drain region 110 from the drain wiring 70.

The gate wiring 80 may be disposed between the stem portion 62 of the source wiring 60 and the stem portion 72 of the drain wiring 70 and may be approximately orthogonal to the teeth portions 64 and 74 when viewed from above and may be approximately parallel with the stem portions 62 and 72. That is, the gate wiring 80 may be disposed in an approximate center between the stem portions 62 and 72. The gate wiring 80 may be formed to have a via (gate via) 82. The gate wiring 80 may be connected to a gate 120 shown in FIG. 3 through the via 82.

As shown in FIG. 3, the gate 120 may include a parallel portion 122 extending in an approximately parallel with the teeth portion 64 of the source wiring 60 and the teeth portion 74 of the drain wiring 70 and one orthogonal portion 124 formed on the same layer as the parallel portion 122 and extending to be orthogonal to the parallel portion 122. The parallel portion 122 may have two ends 126 and extend to both sides from the one orthogonal portion 124. The via 82 may be disposed in the orthogonal portion 124 and may be disposed at a position deviating from an intersecting point of the parallel portion 122 and the orthogonal portion 124.

Two body wirings 90 may be formed at both sides of the gate 120, the source region 100, and the drain region 110 so as to be approximately parallel with the orthogonal portion 124 of the gate 120. The body wiring 90 may be formed to have a via (body via) 92. The body wiring 90 may be electrically connected to the body region of a silicon on insulator (SOI) substrate to be described later through the via 92. The body region may be formed below the gate 120. The body vias 92 may be formed, for example, at both sides of the parallel portion 122 of the gate 120 as shown in FIG. 3. Voltage may be applied to the body region through the via 92.

Next, the three-dimensional position relation of the above-mentioned wiring, region, and via will be described with reference to cross-sectional views.

Figure 4:
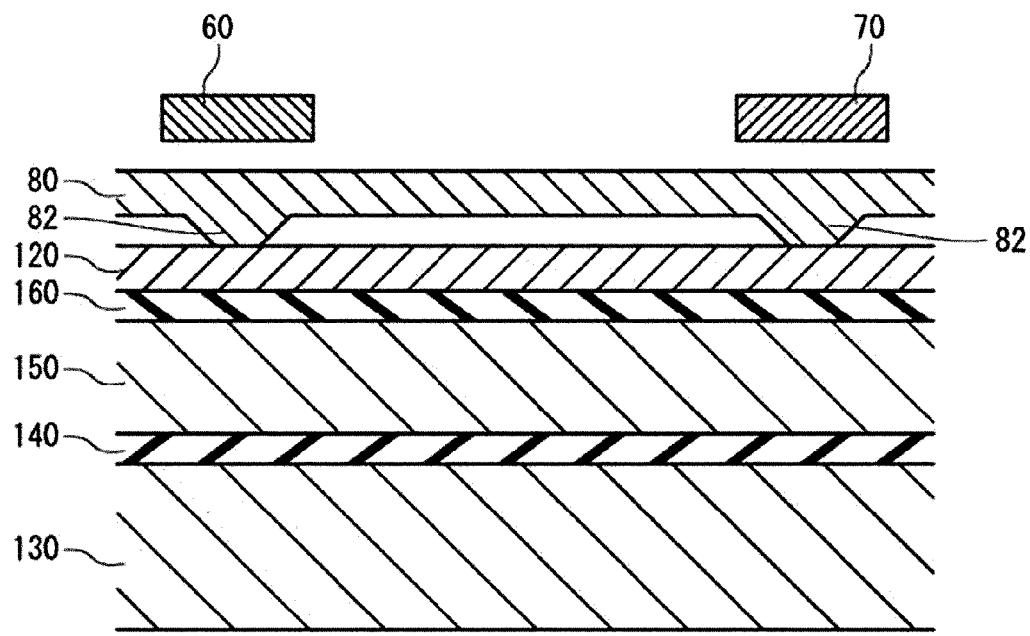
FIG. 4 is a cross-sectional view taken along line 4-4 of FIG. 2.
Figure 5:
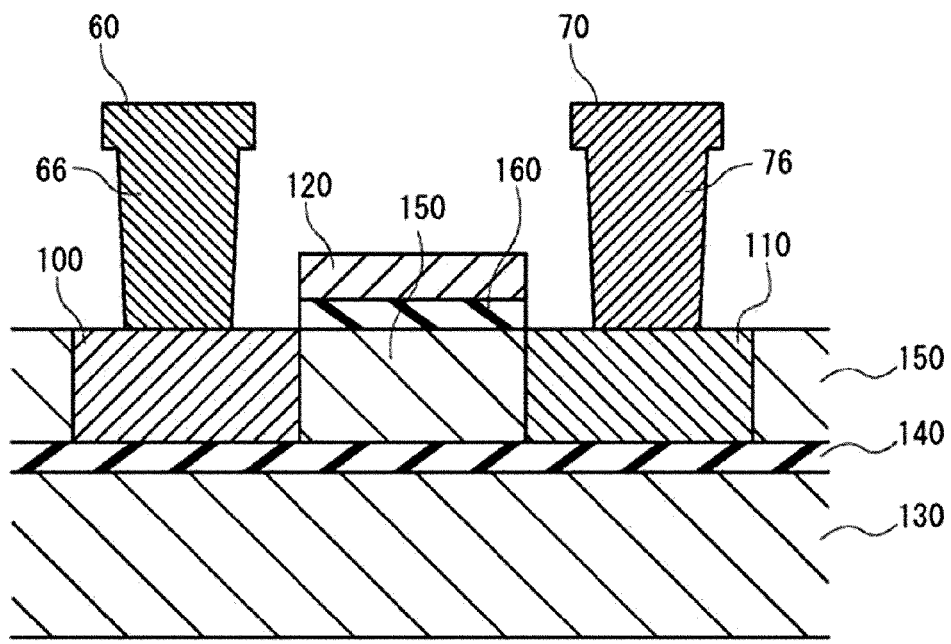
FIG. 5 is a cross-sectional view taken along line 5-5 of FIG. 2.

FIG. 4 is a cross-sectional view taken along line 4-4 of FIG. 2, FIG. 5 is a cross-sectional view taken along line 5-5 of FIG. 2, FIG. 6 is a cross-sectional view taken along line 6-6 of FIG. 2, and FIG. 7 is a cross-sectional view taken along line 7-7 of FIG. 2. For reference, FIGS. 4 to 7 do not show a portion of an interlayer insulating film.

As shown in FIGS. 4 to 7, the FET 50 may be formed on the SOI substrate. A silicon oxide insulating film 140 may be formed on any one conductive (for example, a P type) silicon substrate 130. A semiconductor layer 150 on the insulating film 140 may be formed with a conductive (for example, an N type) source region 100 and drain region 110 different from the substrate. The gate 120 may be formed above the body region 150 between the source region 100 and the drain region 110, having an oxide film 160 inter posed therebetween.

The gate 120 may be formed of a poly silicon layer. As shown in FIGS. 4 and 7, the gate wiring 80 may be formed over the gate 120 and may be electrically connected to the gate 120 via the via 82. The via 82 may be formed by injecting a metallic material into a via hole generated by opening a portion of the interlayer insulating film.

The source wiring 60 and the drain wiring 70 may be formed above the gate 120 so as not to contact the gate 120. As shown in FIG. 5, the source wiring 60 and the drain wiring 70 may be electrically connected to the source region 100 and the drain region 110 through the vias 66 and 76, respectively. The vias 66 and 76 may be formed by injecting a metallic material into the via hole generated by opening the interlayer insulating film.

As shown in FIG. 6, the body wiring 90 may be formed in both sides of and above the gate 120. The via 92 connected to the body wiring 90 may be connected to the body region 150. As shown in FIG. 7, the body wiring 90 may be formed at the same height as the gate wiring 80.

As shown in FIG. 7, the source wiring 60 may be formed to cover the gate wiring 80 and the gate 120. The source wiring 60 may apply voltage to the source region 100 divided by the body region 150 provided under the gate 120, via the via 66.

Next, a compared form for the embodiment of the present invention will be described.

Figure 8:
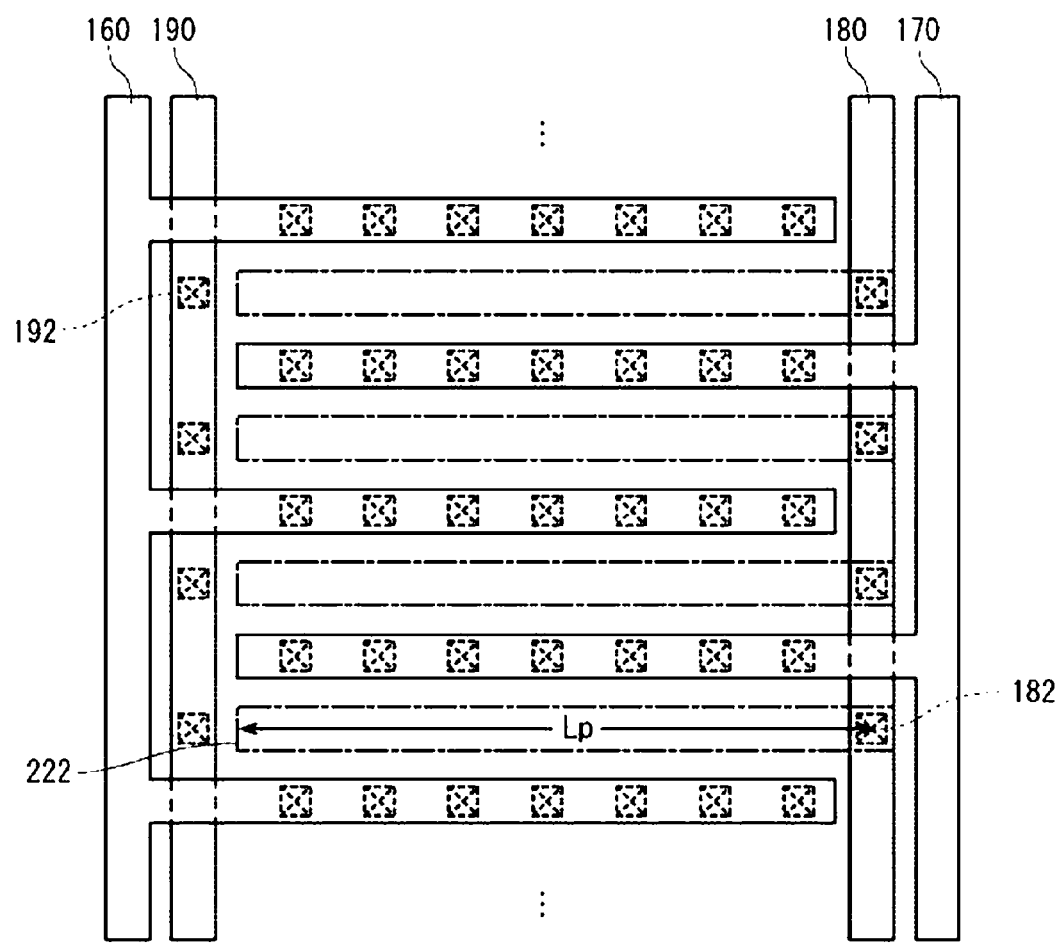
FIG. 8 is a plan view showing wirings of a compared form.

FIG. 8 is a plan view showing wirings of a compared form.

As shown in FIG. 8, in the compared form, the source wiring 160, the drain wiring 170, and the gate wiring 180 may be each formed in a comb type. Therefore, voltage drops by a length of a distance Lp from a gate via 182 formed in the gate wiring 180 to an end of a gate 220 may be generated, whereby voltage distribution may be deteriorated. As a result, insertion loss characteristics and harmonic characteristics may be deteriorated.

Meanwhile, as shown in FIG. 2, in the embodiment of the present invention, the gate wiring 80 may be formed between the source wiring 60 and the drain wiring 70, and the via 82 may be disposed along the gate wiring 80. Further, the parallel portion 122 of the gate 120 may be formed to have two ends 126. Therefore, a distance L from the via 82 to two respective ends 126 of the gate 120 may be shorter than the distance Lp of FIG. 8. In other words, since the parallel portion 122 of the gate 120 is formed with two ends 126, a path from the via 82 to the end 126 is divided into two rather than one, and each distance may be short. The voltage drop is reduced to correspond to the shortened distance, such that the voltage distribution may be uniform in the gate 120. Since the voltage is uniform in the gate 120, an inverting layer formed in the body region 150 may be uniform and the insertion loss characteristics may be improved. Further, when the voltage distribution is uniform in the gate 120, the signal distortion may be removed and therefore, the harmonic characteristics may be improved.

In particular, when the gate wiring 80 is disposed in the center between the source wiring 60 and the drain wiring 70, the gate wiring may be bisymmetrical. Further, a distance from the via 82 to the end 126 of the gate 120 may correspond to about a half of a distance Lp. Therefore, the voltage distribution may be relatively more uniform in the gate 120 and therefore, the insertion loss characteristics and the harmonic characteristics may be improved.

In addition, in the compared form shown in FIG. 8, one body wiring 190 is formed at one side. The body region to which voltage is applied from the body wiring 190 is formed below the gate 220. Therefore, a distance from a via 192 to an end of the body region may correspond to the distance Lp from the gate via 182 to the end of the gate 220. The voltage applied to the body region also has the generation of the voltage drop by an approximate length of the distance Lp. In the compared form, the voltage distribution is also deteriorated in the body region and as a result, the insertion loss characteristics and the harmonic characteristics may be deteriorated.

Meanwhile, as shown in FIG. 2, in the embodiment of the present invention, the body wirings 90 may be formed left and right. The body region 150 under the gate 120 may receive voltage applied thereto from the vias 92 at both sides (left and right in the drawings) and therefore, a distance causing the voltage drop may be about a half of the distance Lp. As a result, the insertion loss characteristics and the harmonic characteristics may be improved, as compared with the compared form.

(Second Embodiment)

Figure 9:
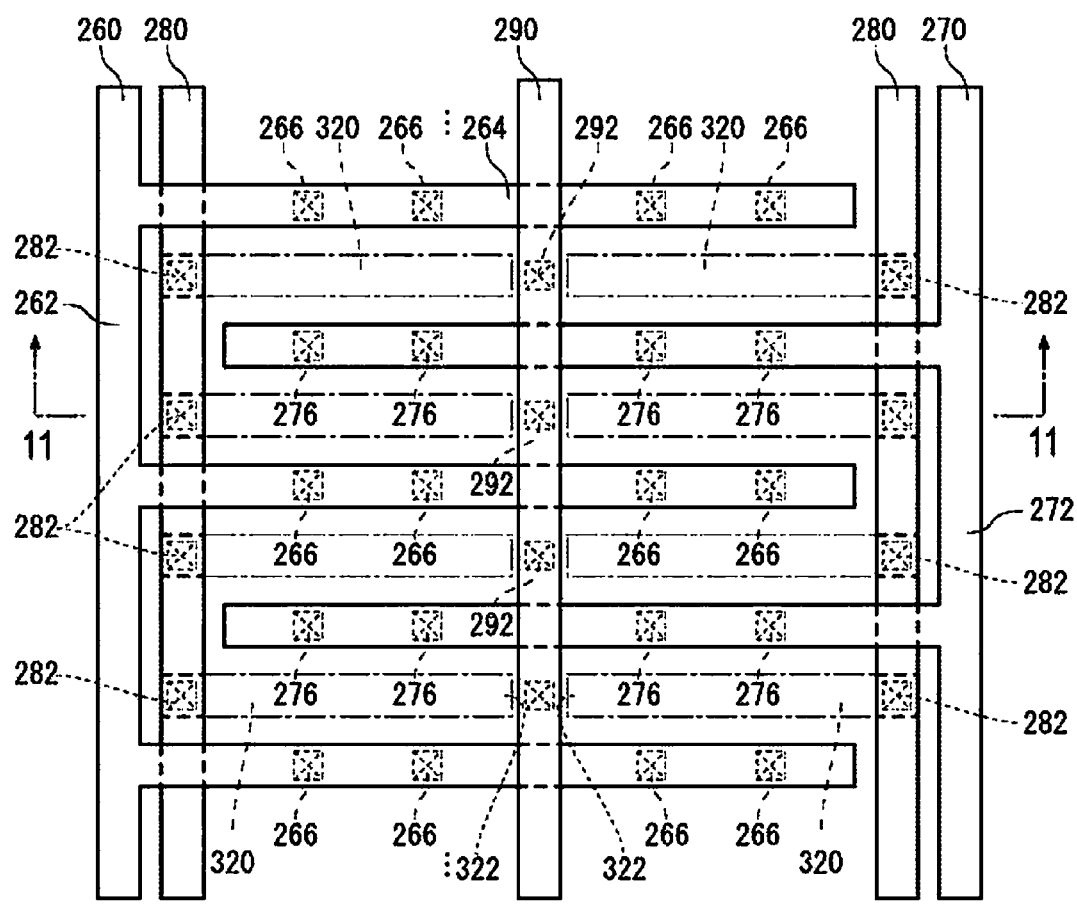
FIG. 9 is a schematic plan view showing gate, source, and drain wirings of an FET included in a high frequency semiconductor switch according to a second embodiment of the present invention.
Figure 10:
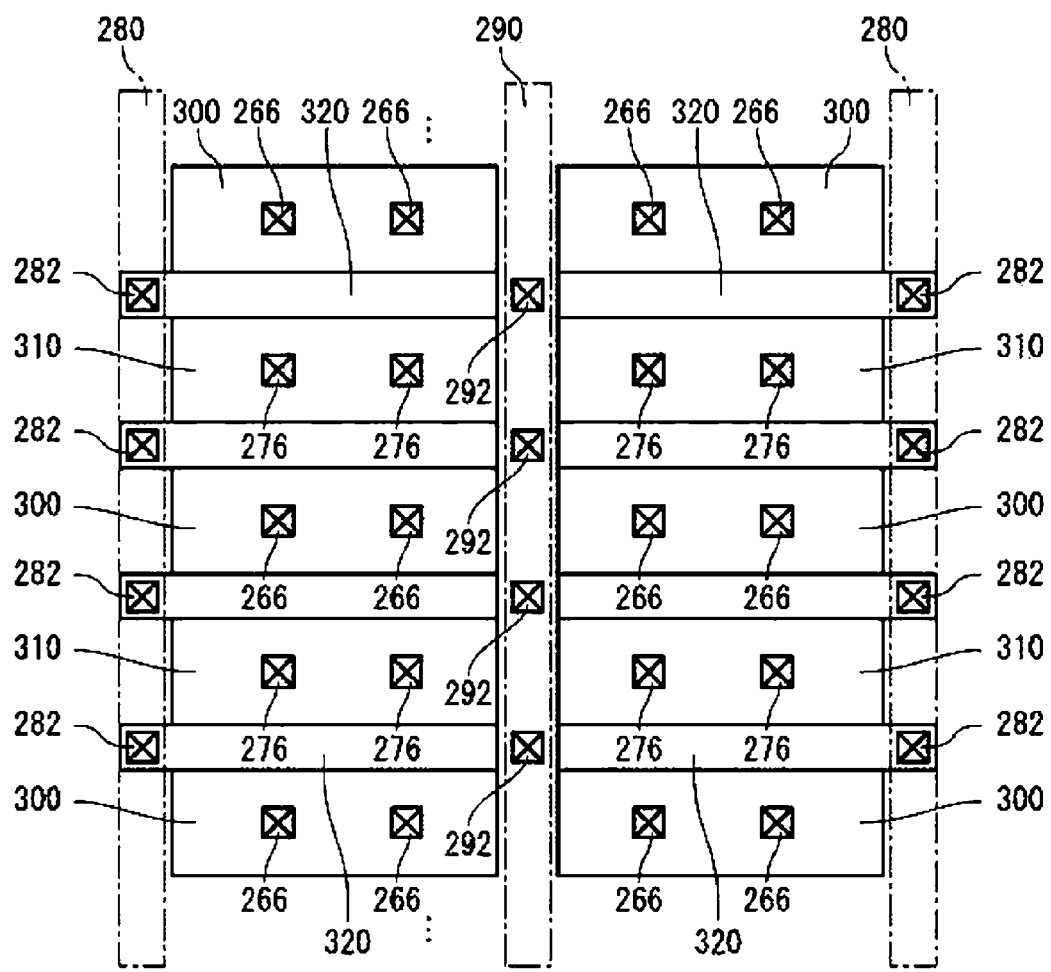
FIG. 10 is a schematic plan view showing gate, source, drain wirings disposed under the wiring according to the second embodiment of the present invention.
Figure 11:
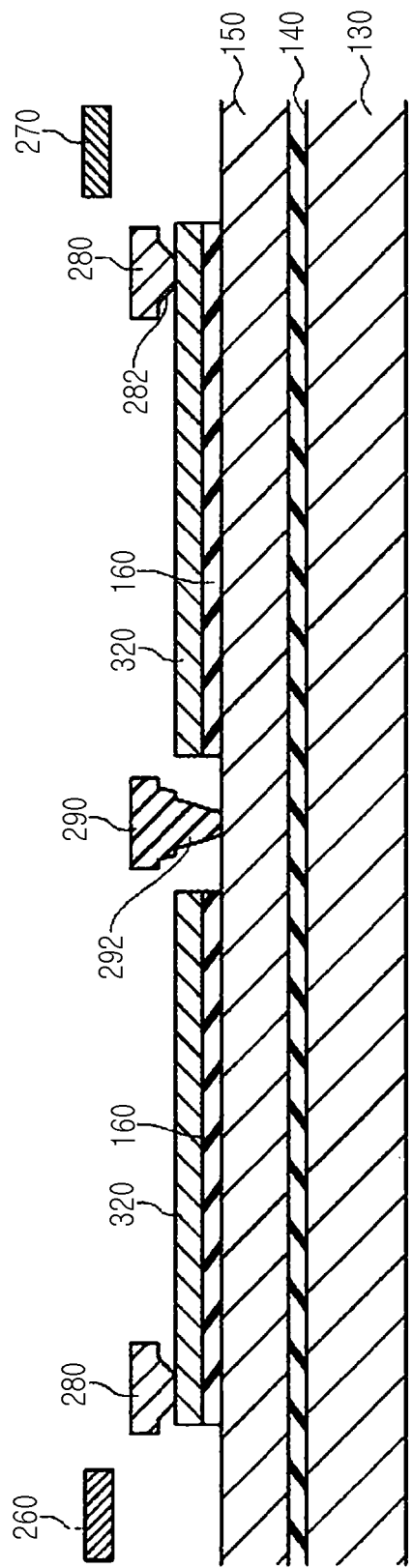
FIG. 11 is a schematic cross-sectional view of the FET taken along line 11-11 of FIG. 9.

FIG. 9 is a schematic plan view showing gate, source, drain wirings of an FET included in a high frequency semiconductor switch according to a second embodiment of the present invention, FIG. 10 is a schematic plan view showing gate, source, drain wirings disposed under the wiring according to the second embodiment of the present invention, and FIG. 11 is a schematic cross-sectional view of the FET taken along line 11-11 of FIG. 9. The same components as those of the first embodiment of the present invention are denoted by the same reference numerals and the description thereof will be omitted.

In the FET 50 included in the high frequency semiconductor switch according to the second embodiment of the present invention, a source wiring 260 and a drain wiring 270 may be formed in a comb type similar to the first embodiment of the present invention. The source wiring 260 and the drain wiring 270 may respectively include stem portions 262 and 272, teeth portions 264 and 274, and vias 266 and 276. As shown in FIG. 9, two gate wirings 280 may be formed at both sides in parallel with the stem portions 262 and 272 of the source wiring 260 and the drain wiring 270.

Two gate wirings 280 may extend in a direction orthogonal to a direction (one direction) in which the teeth portions 264 and 274 of the source wiring 260 and the drain wiring 270 extend and may be formed, having a gate 320 (parallel portion) therebetween. The gate 320 may be divided into two in one direction and extend so as to approximate to each gate wiring 280. Tow ends 322 of the gate 320 may be disposed at both sides of the body wiring 290.

The gate wiring 280 may have a gate via 282 and may be electrically connected to the gate 320 through the via 282. The via 282 may be disposed at the intersecting point of the gate wiring 280 and the gate 320.

The body wiring 290 may be approximately parallel with the gate wiring 280 and may be formed between the divided gate 320 when viewed from above. The body wiring 290 may be formed to extend and be disposed, so as to pass between the divided source region 300 and drain region 310, in a center portion therebetween, when viewed from above. The body wiring 290 may have the body via 292 formed therein, and as shown in FIG. 11, may be connected to the body region 350 formed on the SOI substrate. The voltage may be applied to the body region from the body wiring 290 through the body via 292.

In the FET 50 according to the second embodiment of the present invention configured as described above, the gate 320 may be divided into two in one direction and each thereof may extend toward the center between the source wiring and the drain wiring. Due to the division of the gate 320, the distance from the via 282 to the end 322 of the gate 320 may be about a half, as compared with that of the type shown in FIG. 8. The voltage drop may be reduced as a voltage applying distance is relatively short, such that the voltage distribution may be uniform in the gate 320.

In addition, since the body wiring 290 is formed at the center portion between the source wiring and the drain wiring, the distance from the via 292 to the end of the body region 350 becomes about a half, as compared with the form shown in FIG. 8. Therefore, the voltage drop may be reduced as the voltage applying distance is short, such that the voltage distribution may be uniform in the body region 350. As described above, in the second embodiment of the present invention, as compared with the compared form of FIG. 8, the voltage distribution of the FET 50 may be also uniform, and as a result, the insertion loss characteristics and the harmonic characteristics may be improved.

In the specification, when viewed from above, the first embodiment of the present invention describes the form in which the gate wiring is disposed at the center between the source wiring and the drain wiring and the body wirings are disposed at both sides and the second embodiment of the present invention describes the form in which the body wiring is disposed at the center between the source wiring and the drain wiring, and the gate wirings are disposed at both sides. The embodiments of the present invention need to satisfy the disposition relation when viewed from above. The position relation of the height of the gate wiring, the source wiring, the drain wiring, and the body wiring may be variously designed. For example, in the first embodiment of the present invention, the body wiring 90 may be formed at a higher position than the source wiring 60 and the drain wiring 70.

In addition, the embodiments of the present invention describe the case in which the source wirings 60 and 260 and the drain wirings 70 and 270 are a comb type, but are not limited thereto. Even in a case in which the source wirings 60 and 260 and the drain wirings 70 and 270 are not a comb type, it is not limited as long as they are formed to extend in a direction of at least one position. For example, one teeth portion 64 may be set to be the source wiring 60 extending unidirectionally, and one teeth portion 74 may be set to be the drain wiring 70 extending approximately in parallel with the source wiring 60.

As set forth above, according to the embodiments of the present invention, the insertion loss characteristics and the harmonic characteristics may be improved.

While the present invention has been shown and described in connection with the embodiments, it will be apparent to those in the art that modifications and variations can be made without departing from the spirit and scope of the invention as defined by the appended claims.

What is claimed is:

1. A field effect transistor included in a high frequency semiconductor switch for switching wireless communications, comprising:
   a source wiring electrically connected to a source region formed on a substrate and extending unidirectionally;
   a drain wiring electrically connected to a drain region formed on the substrate and extending in parallel with the source wiring;
   a gate having a parallel portion extending between the source wiring and the drain wiring in parallel therewith;
   a gate wiring applying voltage to the gate; and
   a gate via electrically connecting the gate to the gate wiring,
   wherein the parallel portion includes two ends being formed between the source wiring and the drain wiring and having a path for voltage to be applied from the gate via to each of the two ends.

2. The field effect transistor of claim 1, wherein the gate has an orthogonal portion formed on the same layer as the parallel portion and extending to be orthogonal to the parallel portion, and
   the via is formed in the orthogonal portion.

3. The field effect transistor of claim 2, wherein one orthogonal portion is formed, and
   the parallel portion extends to both sides from the orthogonal portion.

4. The field effect transistor of claim 3, further comprising:
   a body region formed on the substrate so as to be disposed under the gate;
   a body wiring applying voltage to the body region; and
   a body via electrically connecting the body region with the body wiring,
   wherein the body wiring is formed at both sides of the gate to be in parallel with the orthogonal portion.

5. The field effect transistor of claim 1, wherein two gate wirings extend in a direction orthogonal to one direction, having the parallel portion disposed therebetween, and
   the parallel portion is divided into two and extends to approximate to each gate wiring.

6. The field effect transistor of claim 5, further comprising:
   a body region formed on the substrate so as to be disposed under the gate;
   a body wiring applying voltage to the body region; and
   a body via electrically connecting the body region with the body wiring,
   wherein the body wiring is formed between the divided parallel portion to be in parallel with the gate wiring.

* * * * *